(12) United States Patent
Dittus et al.

(10) Patent No.: US 7,731,524 B2
(45) Date of Patent: Jun. 8, 2010

(54) BLIND DOCKING ELECTRICAL CONNECTOR

(75) Inventors: Karl Klaus Dittus, Durham, NC (US); Michael Sven Miller, Raleigh, NC (US); Stephen Peter Mroz, Rochester, MN (US); John Joseph Struble, Jr., Mebane, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/106,516

(22) Filed: Apr. 21, 2008

(65) Prior Publication Data

US 2009/0263992 A1    Oct. 22, 2009

(51) Int. Cl.
*H01R 13/60* (2006.01)
(52) U.S. Cl. ............... 439/533; 439/248; 361/727
(58) Field of Classification Search .............. 439/533, 439/532, 374, 248, 247; 361/727, 724, 790
See application file for complete search history.

(56) References Cited

U.S. PATENT DOCUMENTS 3,722,843 A * 3/1973 Enckler ............... 248/300
4,931,907 A * 6/1990 Robinson et al. ........... 361/727
4,980,800 A * 12/1990 Furuta ................. 361/727
5,199,892 A * 4/1993 Campbell et al. ......... 439/246

(Continued)

*Primary Examiner*—T C Patel
*Assistant Examiner*—Harshad C Patel
(74) *Attorney, Agent, or Firm*—Cynthia G. Seal; Jeffrey L. Streets

(57) ABSTRACT

Method and apparatus for blind docking an electronic device or module with an electrical connector, for example within a rack for a computer system. A forwardly-directed power connector is secured to a distal end of at least one rail or shelf bracket for blind docking with a rearwardly-directed power connector on the electronic module. The shelf bracket securing the forwardly-directed electrical connector is included in a pair of longitudinally-extending shelf brackets secured to opposing vertical side walls of a rack at a common elevation to form a module bay. The electronic module may slide along the shelf bracket until a rearwardly-directed power connector of the electronic module blind docks with the forwardly-directed power connector. A boss or alignment stud may be included on the bracket to improve alignment of the connectors. The forwardly-direct electrical connector may also be secured to the bracket with a floating connection to enable minor adjustments in alignment during blind docking.

15 Claims, 8 Drawing Sheets

U.S. PATENT DOCUMENTS

| | | | | |
|---|---|---|---|---|
| 5,333,097 A * | 7/1994 | Christensen et al. | ... | 361/679.39 |
| 5,838,550 A * | 11/1998 | Morris et al. | ... | 361/818 |
| 5,924,877 A * | 7/1999 | Byrne et al. | ... | 439/101 |
| 6,097,200 A * | 8/2000 | Turlapaty et al. | ... | 324/760 |
| 6,142,796 A * | 11/2000 | Behl et al. | ... | 439/131 |
| 6,152,819 A * | 11/2000 | Sasaki et al. | ... | 454/184 |
| 6,318,823 B1 | 11/2001 | Liao | | |
| 6,456,489 B1 * | 9/2002 | Davis et al. | ... | 361/679.58 |
| 6,469,899 B2 | 10/2002 | Hasting et al. | | |
| 6,473,307 B2 | 10/2002 | Mallette | | |
| 6,496,364 B1 * | 12/2002 | Medin et al. | ... | 361/686 |
| 6,653,802 B1 * | 11/2003 | Nelson et al. | ... | 315/291 |
| 6,700,197 B2 * | 3/2004 | Sato et al. | ... | 257/727 |
| 6,739,682 B2 | 5/2004 | Shih | | |
| 6,741,463 B1 * | 5/2004 | Akhtar et al. | ... | 361/686 |
| 6,754,066 B2 | 6/2004 | Doan et al. | | |
| 6,856,505 B1 | 2/2005 | Venegas et al. | | |
| 6,937,461 B1 * | 8/2005 | Donahue, IV | ... | 361/622 |
| 6,962,397 B2 | 11/2005 | Dobler et al. | | |
| 7,365,964 B2 * | 4/2008 | Donahue, IV | ... | 361/622 |
| 2003/0161114 A1 * | 8/2003 | Berry et al. | ... | 361/727 |
| 2003/0193781 A1 * | 10/2003 | Mori | ... | 361/725 |
| 2004/0057216 A1 | 3/2004 | Smith et al. | | |
| 2005/0068745 A1 | 3/2005 | Hartman | | |
| 2005/0117309 A1 | 6/2005 | Rieken et al. | | |
| 2006/0063411 A1 * | 3/2006 | Kim et al. | ... | 439/247 |
| 2006/0199409 A1 * | 9/2006 | Chen et al. | ... | 439/247 |
| 2007/0242420 A1 | 10/2007 | Hoshino et al. | | |

* cited by examiner

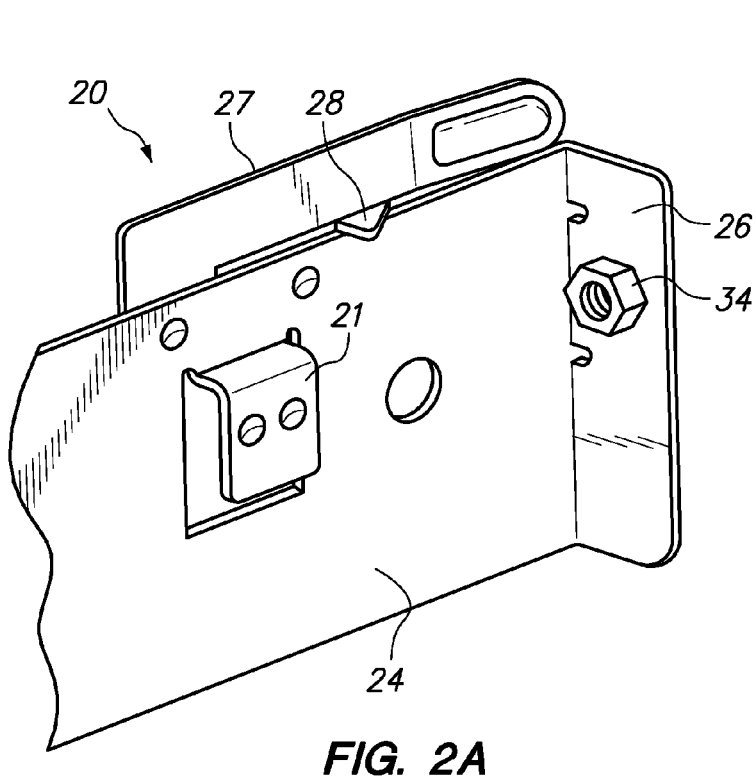
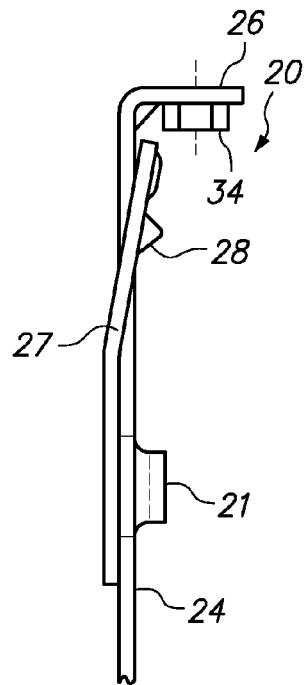
*FIG. 2A*  *FIG. 2B*
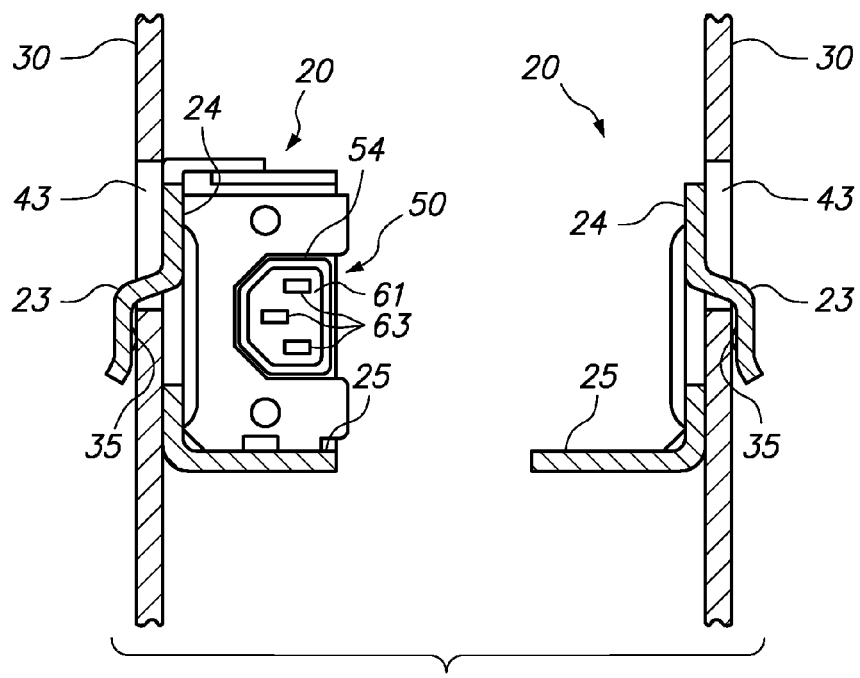
*FIG. 3*

BLIND DOCKING ELECTRICAL CONNECTOR

BACKGROUND OF THE INVENTION

1. Field of the Invention

The present invention relates to adjustable rails for supporting equipment in a rack, and more specifically to rails that can be secured without the use of tools.

2. Background of the Related Art

Electronic devices, including data processing devices such as servers, are typically housed in standardized equipment enclosures. These enclosures have side walls that establish or include a rack. The rack is a substantially rectilinear metal frame having a plurality of mounting and alignment openings or holes that permit mounting various devices in the rack.

Rails are mounted to the walls or other support structure in the rack and form support for the electronic devices or components. The rails are screwed, bolted, or otherwise attached to the rack and the devices are placed on a pair or set of rails secured to opposing walls of the rack. In order to be attached to the rack the length of the rails must be appropriately configured to cooperate with the rack.

Because a computer system may not completely fill a rack and because individual devices or chassis may have various heights, it is desirable to have rails that can be selectively mounted at desired heights within the rack. In this manner, the vertical spacing between rails can be incrementally adjusted to accommodate specific devices as the computer system is being installed or reconfigured. Typically, the height of a device is an integer multiple of a "unit" height (otherwise known as a "U"), wherein each unit of height measures 1.75 inches. Standardized rack specifications are provided by the Electronic Industries Alliance (EIA).

BRIEF SUMMARY OF THE INVENTION

One embodiment of the invention provides a system comprising a rack with opposing vertical side walls, a pair of longitudinally-extending shelf brackets secured to the opposing vertical side walls at a common elevation to form a bay for receiving an electronic module; and a forwardly-directed power connector secured to a distal end of at least one of the shelf brackets for blind docking with a rearwardly-directed power connector on the electronic module.

Another embodiment of the invention provides a method of blind docking an electronic module in a rack. The method comprises securing a forwardly-directed power connector onto a distal end of a shelf bracket, securing the shelf bracket to a wall of the rack in a longitudinal position for selective supporting one side of an electronic module, and sliding the electronic module along the shelf bracket toward the distal end of the shelf bracket until a rearwardly-directed power connector on a distal end of the electronic module blind docks with the forwardly-directed power connector.

BRIEF DESCRIPTION OF THE SEVERAL VIEWS OF THE DRAWINGS

FIGS. 2A-B are perspective and top views of a proximal end of a rail.

FIG. 3 is a cross-sectional view of opposing rails secured to opposing side walls of a rack.

DETAILED DESCRIPTION OF THE INVENTION

Figure 1A:
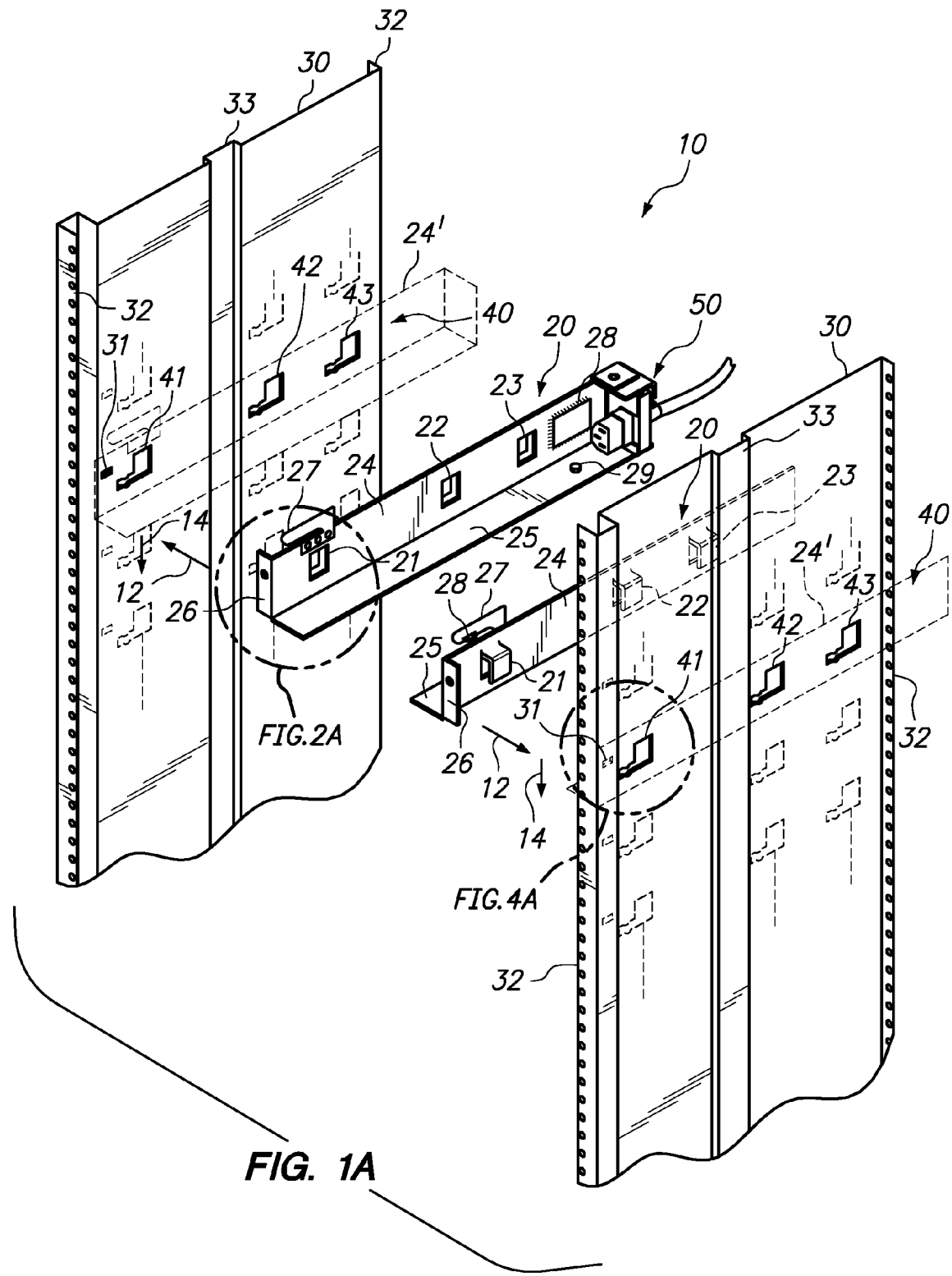
FIGS. 1A-C are perspective views of two rails being stepwise aligned, secured and latched to opposing side walls of a rack.

One embodiment of the invention provides a system comprising a rack with opposing vertical side walls, a pair of longitudinally-extending shelf brackets secured to the opposing vertical side walls at a common elevation to form a bay for receiving an electronic module; and a forwardly-directed power connector secured to a distal end of at least one of the shelf brackets for blind docking with a rearwardly-directed power connector on the electronic module. As an electronic module is received into the bay, the shelf bracket registers a leading edge of the electronic module to align the rearwardly-directed power connector with the forwardly-directed power connector. If the rails are spaced apart at a distance that is significantly greater than the width of the electronic module being received on the rails, then electronic module may be centered laterally within the rack providing each of the shelf brackets with a boss adjacent the distal end of the rail, or providing each side of the chassis with a boss adjacent the leading edge. Optionally, the at least one shelf bracket may include a shelf having a stud, wherein the electronic module has a rearwardly-directed, tapered slot for fine axial alignment of the power connectors as the electronic module is being received in the bay prior to blind docking.

Optionally, the rail secures the forwardly-directed power connector in a manner that allows the connector to "float" or provide a limited degree of self-adjustment. For example, the forwardly-directed power connector may be forwardly-biased, such as using a spring. Furthermore, a standoff may be used to allow the forwardly-directed power connector to float within a plane perpendicular to the axis of the forwardly-directed power connector.

A still further embodiment of the invention provides a method of blind docking an electronic module in rack. The method comprises securing a forwardly-directed power connector onto a distal end of a shelf bracket, securing the shelf bracket to a wall of the rack in a longitudinal position for selective supporting one side of an electronic module, and sliding the electronic module along the shelf bracket toward the distal end of the shelf bracket until a rearwardly-directed power connector on a distal end of the electronic module blind docks with the forwardly-directed power connector.

Optionally, the method may further include engaging the distally sliding electronic module against a boss formed on one or more of the shelf brackets to improve lateral alignment (when there is excessive clearance between the chassis and rail) of the rearwardly-directed power connector with the forwardly-directed power connector. In another option, the method includes engaging a rearwardly-directed, taper slot on the distally sliding electronic module with a stud formed on the shelf bracket to improve lateral alignment of the rearwardly-directed power connector with the forwardly-directed power connector. In yet another option, the method includes forwardly-biasing the forwardly-directed power connector. In a separate option, the method includes allowing the forwardly-directed power connector to float within a plane perpendicular to the axis of the forwardly-directed power connector.

The systems and methods described in this application are beneficial in various device configurations that utilize blind docking. For example, blind docking an electronic device or module to an electrical connector is necessary or beneficial to avoid the need for access to the back of a computer system rack. Furthermore, the systems and methods described in this application are suitably used in cooperation with adjustable shelf brackets that can be easily installed, removed and re-installed at other elevations or in other racks. Still further, the systems and methods of the invention may be utilized for blind docking with electronic devices or modules of any size or configuration, such as modules that are one or more "U" in height and full or partial width.

The various embodiments of the invention may be understood in greater detail by reference to a specific embodiment set out in the following drawings. It should be understood that the embodiment shown in the following Figures is described as an example of the invention and that the invention is not limited to this embodiment. It should be particularly recognized that the shelf bracket attachment system and method in the following Figures is preferred, but that the electronic connector and method of blind docking may be used with other bracket or rail designs and with other schemes for attachment of the rail to the rack.

Figure 1B:
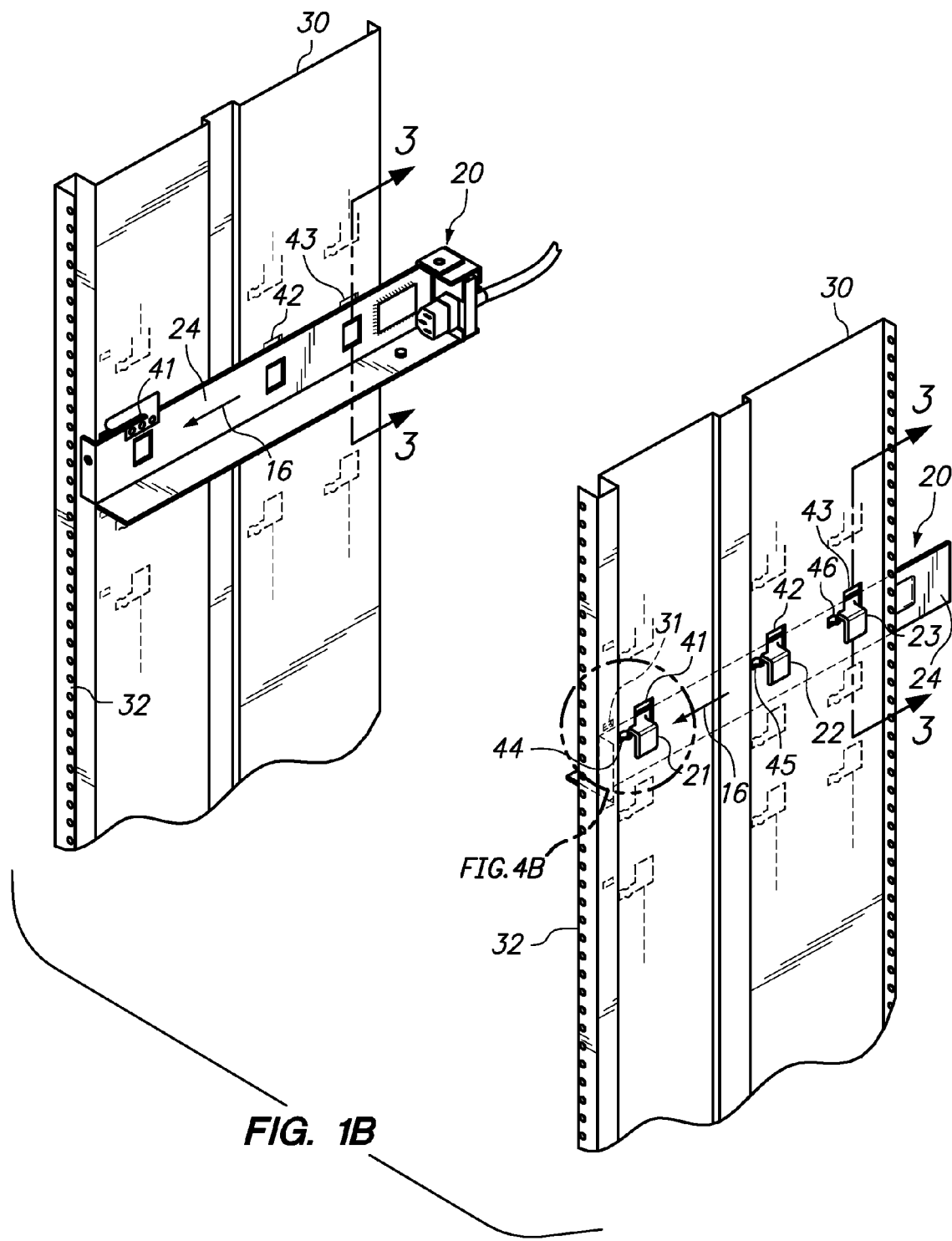
Figure 1C:
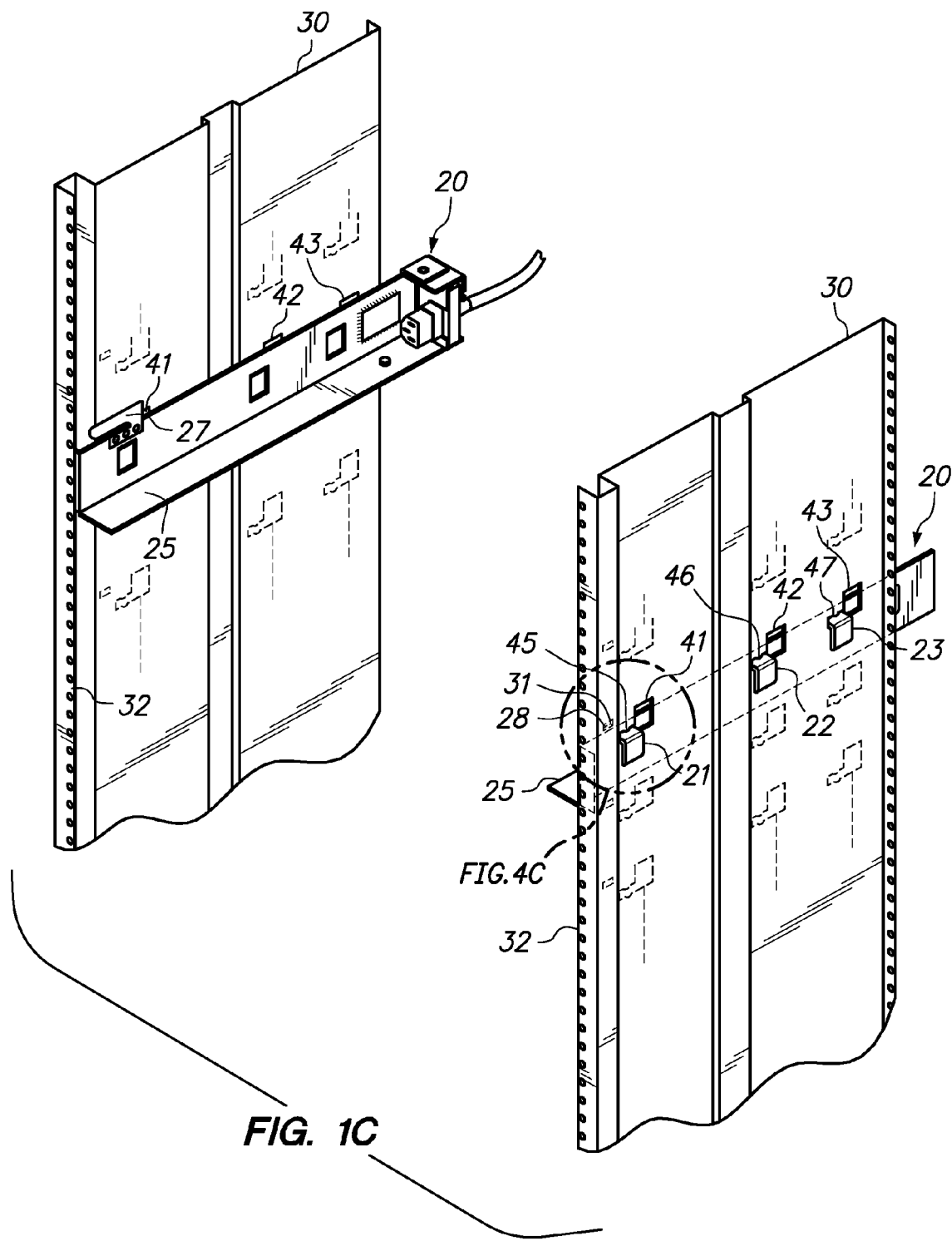

FIGS. 1A-C are perspective views of two rails being step-wise aligned, secured and latched to opposing side walls of a rack. In FIG. 1A, a system 10 includes a pair of longitudinally-extending rails 20 and a pair of opposing side walls 30 that are part of a rack. Each longitudinally-extending rail 20 has a proximal clip 21, a distal clip 23 and an optional intermediate clip 22. As shown, the clips 21-23 are cut and bent from a single metal sheet that also forms a rail side wall 24, a shelf 25, and a flange 26. Each rail further includes a latch 27 including an outwardly-directed latch element 28. Each latch 27 is preferably flexible to outwardly bias the latch element 28 so that the latch element will automatically and securely engage a latch hole 31 in the rack side wall 30. It should be recognized that the elements of the two rails that have been described so far are substantially mirror images of each other. As such, the two rails are not intended to be interchangeable with each other, although both rails may be secured to the side wall at various elevations by engaging a different set of holes.

The rack side walls 30 have an EIA flange 32 along a proximal edge and a distal edge. The rigidity of the walls 30 may be increased by certain corrugations 33 and/or attachment to other members (not shown). The vertical positioning and spacing of the side walls 30 are also secured by interconnecting members (not shown), which may extend between the side walls across the top, bottom and other positions to provide a strong and stable rack. The vertical side walls 30 also include holes arranged in longitudinal sets 40 at various elevations. Each set 40 includes a proximal hole 41, a distal hole 43, and an optional intermediate hole 42. The number, position, and size of the holes in each set 40 must accommodate the set of clips provide on the rail 20 (here shown as clips 21-23). Additional holes may be included if desired.

In one embodiment, at least one of the rails 20 further includes an electrical connector 50 secured in a forwardly-directed position at a distal end of the rail. While the Figures show a standard connector for alternating current (AC), the electrical connector could instead provide direct current (DC). As described in relation to other Figures, the distal end of the rail may further include a boss 28 and/or a stud 29 to assist in alignment of an electronic device or module so that a rearwardly-directed connector on the device or module will blind dock with the connector 50.

The two opposing rails 20 are shown in a longitudinal position with each of the clips 21-23 aligned for insertion into holes 41-43 of set 40, which preferably have the same elevation within the rack. Accordingly, moving the rails 20 laterally as shown by arrows 12 positions the rail side wall 24 against the rack side wall 30 as shown by the dashed outline 24' and causes insertion of the clips into the holes. After the clips are inserted into the holes, the rails 20 are lowered in the direction of arrows 14 so that each rail hangs from the respective side wall 30 by its clips. Furthermore, the clips 21-23 engage the outer surfaces of the rack side walls 30 and the rail side walls 24 engage the inner surfaces of the rack side walls 30, thereby gripping the rack side wall and preventing lateral movement of the rails 20. The resulting position of the rails 20 and clips 21-23 is shown in FIG. 1B.

In FIG. 1B, both rails 20 are vertically supported from the holes 41-43 by the rack side walls 30. The clips 21-23, which now extend through the holes 41-43, are most clearly shown on right hand side wall (in the view shown). Furthermore, now that the rails 20 hang from the clips, the rail is lower than shown in FIG. 1A and a portion of the holes 41-43 can be seen extending above the top edge of the rails 20. Optionally, the height of the rail side wall 24 may be sufficiently tall to cover the holes 41-43.

As shown in FIG. 1B, the rail 20 could be easily lifted in order to withdraw the clips 21-23 from the holes 41-43. However, to continue the installation and secured the rails against accidental lifting, the rail 20 is moved longitudinally in the direction of arrows 16 so that each clip 21-23 slides from the respective hole 41-43 into a respective slot 44-46. The resulting position of the rail 20 and clips 21-23 is shown in FIG. 1C.

In FIG. 1C, both rails 20 are vertically supported from the slots 44-46 by the rack side walls 30. Accordingly, the clips 21-23 are now offset in a proximal direction from the holes 41-43 in which they were originally inserted. In this position, the rails 20 cannot move vertically (neither up nor down) nor laterally. It may be further appreciated that the outwardly biased latch 27 has moved along with the foregoing movements of the rails 20 so that the latch element 28 has moved into alignment with the latch holes 31 in the rack side wall 30. The biased latch 27 causes the automatic insertion of the latch element 28 into the latch hole 31, thereby preventing longitudinal movement of the rail. Optionally, the latch may be designed to only prevent distal movement of the rail, since the end of the slot 45-47 or the EIA flange 32 may limit proximal movement of the rail.

Accordingly, FIG. 1C shows the rails 20 in their fully secured position, forming a shelf or bay for receiving an electronic device or module. It should be recognized that the latch 27 may be pulled manually, such as with a finger, with sufficient force to overcome the bias and withdraw the latch element 28 from the latch hole 31 so that the rail may be removed. Specifically, this requires releasing the latch, distally sliding the rail so that the clip moves out of the slot into the hole, raising the rail so that the clip releases the side wall 30, and laterally moving the rail to withdraw the clip from the hole. All of the movements used to install or remove a rail according to this embodiment can be easily performed from the front of the rack without any tools.

FIG. 2A is a perspective view of a proximal end of a rail (circled in FIG. 1A). This view shows the rail side wall 24 with the proximal clip 21. The latch 27 is secured to the rail side wall 24 and extends above the rail side wall 24. The latch 27 includes the latch element 28, which extends in the same generally lateral direction as the clip 21 since both the latch element and the clip operate to engage holes in the rack side wall 30. (See FIG. 1A). The proximal end of the rail also includes the flange 26, formed at a right angle to the rail side wall 24, for supporting a captive nut 34 is position to align with a hole in the EIA flange 32 of the rack and receive a bolt (not shown).

FIG. 2B is a top view of the proximal end of the rail 20 shown in FIG. 2A. The latch 27 is shown bent over the top of the rail side wall 24 in a relaxed position. When the rail 20 is being secured to a rack side wall 30, the latch 27 contacts the wall. As the clips draw the rail firmly against the rack side wall, the latch is flexed away from the wall causing a bias within the latch. When the latch element 28 becomes aligned with the latch hole 31 (See FIG. 1A), the latch element automatically enters the latch hole to prevents longitudinal movement of the rail 20.

FIG. 3 is a cross-sectional view of opposing rails secured to opposing side walls of a rack. This cross-section is taken along line 3-3 in FIG. 1B, wherein the distal clip 23 of each rack 20 has been inserted through the hole 43 in the rack side wall 30 and lowered to firmly engage the rack side wall 30 and support the rail 20. The distal clips 23, and all other clips for that matter, are preferably curved or include a boss 35 that engages the outer surface of the rack side wall 30 causing the clip to flex and grip the wall 30 between the boss 35 the rail side wall 24. This gripping engagement prevents lateral movement (side-to-side as shown in FIG. 3) of the rails 20. The configuration and use of the electrical connector 50 and the boss 28 will we discussed later.

Figure 4A:
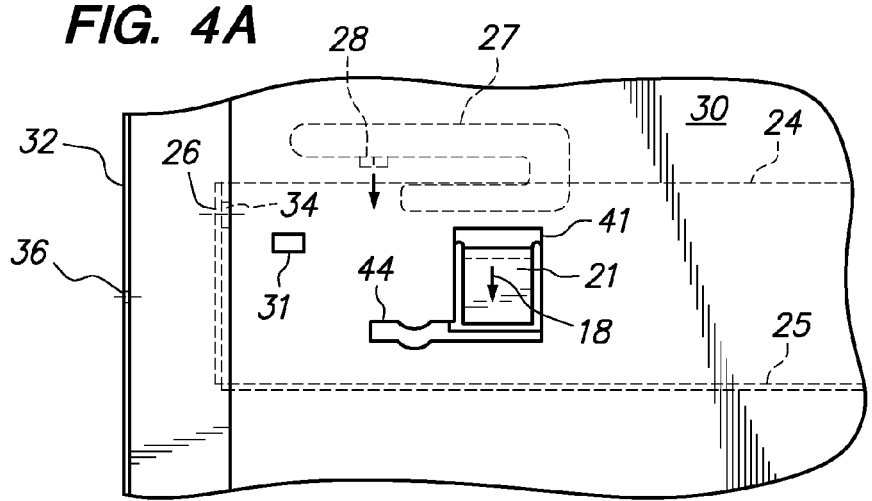
FIGS. 4A-C are side views of a hole in a rack in accordance with FIGS. 1A-C to highlight the aligning, securing and latching of a clip within the hole.
Figure 4B:
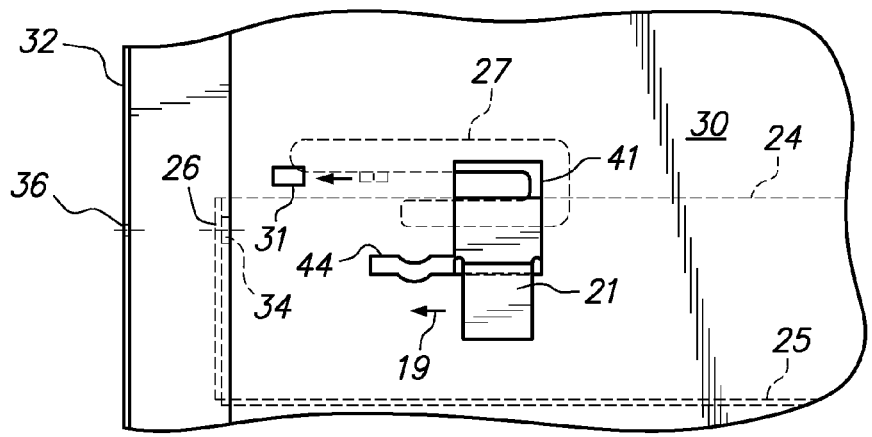
Figure 4C:
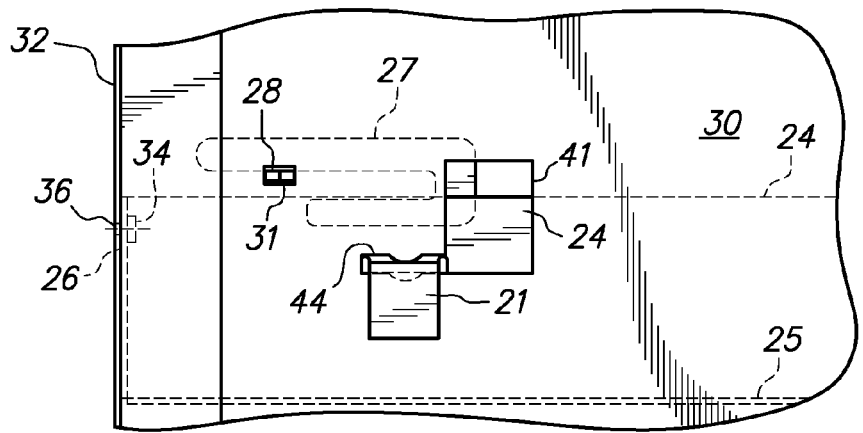

FIGS. 4A-C are side views of the proximal hole 41 in a rack side wall 30 in accordance with the circled portions of FIGS. 1A-C, respectively, which highlight the aligning, securing and latching of the proximal clip 21 within the proximal hole 41. Although these Figures show the engagement of the proximal clip with the proximal hole, it should be recognized that any of the clips in this embodiment engage a corresponding hole in the same manner. The proximal clip 21 and proximal hole 41 were selected for specific discussion in order to also show the movement of the latch 27, which is secured to the rail in a preferred position near the proximal end of the rail 20.

In FIG. 4A, the clip 21 is aligned with the hole 41 for insertion through the hole 41. Note that there is a gap between flange 26 at the proximal end of the rail side wall 24 and the EIA flange 32 of the rack. This gap will be closed when the rail is fully secured. Furthermore, the captive nut 34 that is secured to flange 26 is vertically offset out of alignment with a hole 36 through the EIA flange 32. The captive nut 34 and the hole 36 will be aligned when the rail is fully secured. Also note that the latch element 28 is neither vertically aligned nor longitudinally aligned with the latch hole 31 formed in the rack side wall 30. However, the latch element 28 will be received within the latch hole 31 when the rail is fully secured. If the rail is being secured to the rack side wall, then the next step is to lower the rail in the direction of the arrow 18.

In FIG. 4B, the clip 21, along with the entire rail 24, has been lowered so that the clip engages and/or "hangs" on the rack side wall 30. This is the same general position shown in the cross-sectional view of FIG. 3. Accordingly, the clip 21 extends about the outer surface of the rack side wall 30. Note that there is still a gap between the rail flange 26 and rack flange 32, but the captive nut 34 and the hole 36 are now axially aligned. Furthermore, the latch element 28 (which is biased against the rack side wall 30) is now longitudinally aligned with the latch hole 31. If the rail is being secured to the rack side wall, then the next step is to slide the rail in the proximal direction shown by the arrow 19.

In FIG. 4C, the clip 21 has been moved in the proximal direction to enter the slot 44. The slot 44 may be configured with a boss and opposing relief in order to firmly grip the clip 21 and prevent vertical movement of the clip (either upward or downward). The latch element 28 has been received into the latch hole 31 to prevent longitudinal movement of the rail until the latch is manually released. Still further, the rail flange 26 is now immediately adjacent or in contact with the EIA rack flange 32. Accordingly, FIG. 4C shows the rail fully secured to the rack side wall 30 and ready to receive and support an electronic device or module on the shelf 25.

Figure 5:
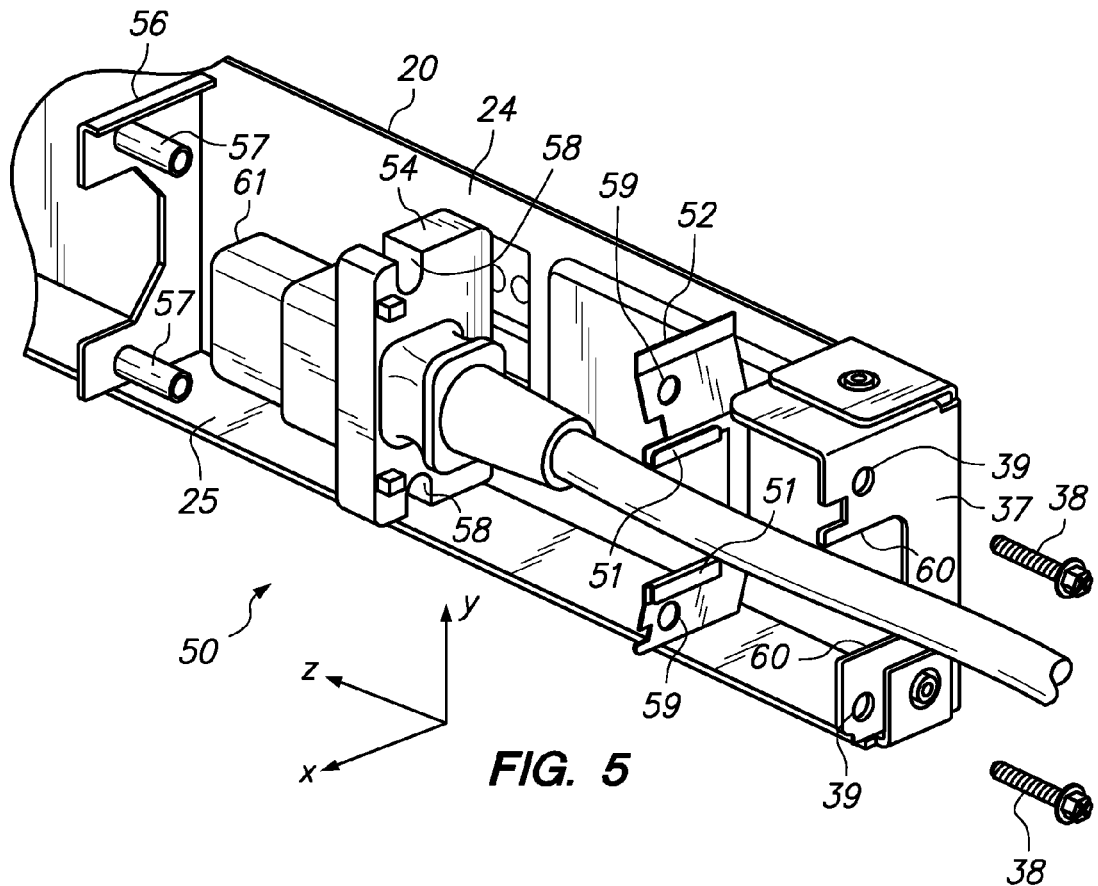
FIG. 5 is an exploded perspective view of a floating electrical connector secured to a rail for blind docking with an electronic module.

FIG. 5 is an exploded perspective view of a floating electrical connector 50 that can be secured to a rail 20 for blind docking with an electronic module. The longitudinal rail 20 includes a rail side wall 24 and a shelf 25 that preferably extend along the length of the rail (See FIGS. 1A-C). However, the distal end of the rail 20 includes an end wall 37 that serves to position and secure the electrical connector. The end wall 37 includes a pair of holes 39 for receiving a pair of bolts or other fasteners 38 used to secure the connector 50.

The electrical connector 50 includes a spring plate 52 that is received against the end wall 37, an electrical plug body 54 that engages the spring plate, and a face plate 56 that engages the electrical plug body 54. The spring plate 52 is preferably secured to the end wall 37 by sliding two tracks 51 into engagement about two opposing edges 60 of a passageway through the end wall. The electrical plug body 54 is pushed against the forward face of the spring plate 52 and secured with the face plate 56. The face plate 56 includes a pair of stand-offs 57 with internal threads for coupling with the bolts 38. The stand-offs 57 extend through a pair of holes or slots 58 formed in the electrical plug body 54 and through a pair of holes or slots 59 through the spring plate 52. Threading the bolts 38 into the threaded stand-offs 57 draws the face plate 56 toward the end wall 37 until the stand-offs 57 are held firmly against the end wall 37.

Figure 6:
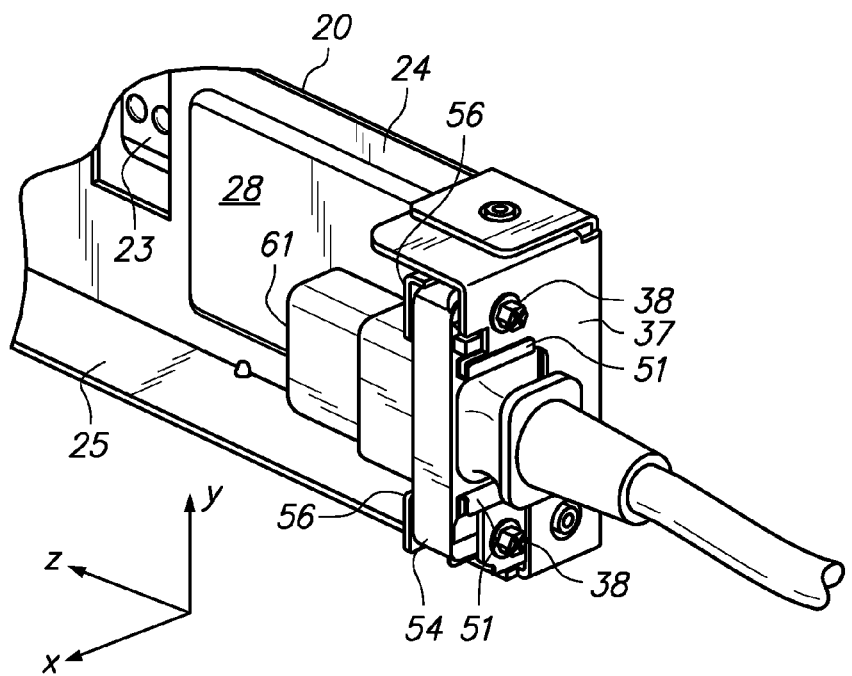
FIG. 6 is a perspective view of the floating electrical connector of FIG. 5 after it is fully assembled.

FIG. 6 is a perspective view of the floating electrical connector 50 of FIG. 5 after it is fully assembled. The electrical plug body 54 is disposed between the spring plate 52 and the face plate 56. The spring plate 52 is held against the end wall 37 and biases the electrical plug body 54 in a forward direction (+Z-direction) against the face plate 56, which is held in a fixed position. Accordingly, the electrical connector 50 may be said to provide "Z-float" because the spring plate 52 can be compressed to allow the plug body 54 to move in a rearward direction (−Z direction) and a forward direction (+Z direction). Furthermore, if the plug body 54 is provided with a slots 58 that are wider than the diameter of the stand-offs 57, then the plug body 54 can move laterally (+X and −X directions) and/or vertically (+Y and −Y directions). This design of the electrical connector 50 gives a limited degree of three-dimensional float that facilitates blind docking of the proximal end 61 (See also FIG. 3) of the plug body 54 with an electronic device or module. As shown in FIG. 3, the proximal end 61 of the plug body 54 includes a set of standard electrical terminals 62 for coupling with mating terminals of a plug on the electronic device or module.

Figure 7:
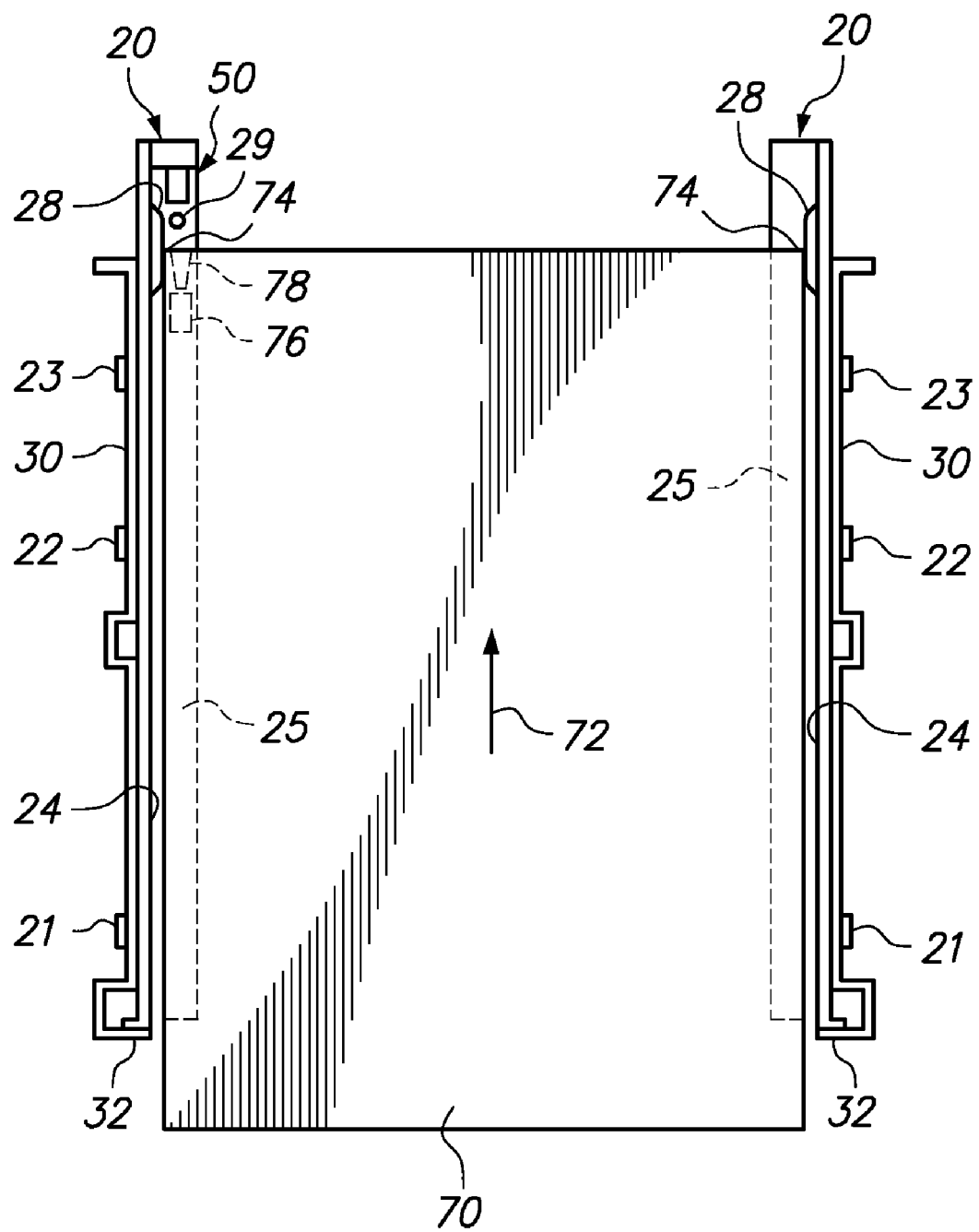
FIG. 7 is a schematic top view of the rack side walls securing a pair of rails to form a shelf or bay for receiving an electronic device or module.

FIG. 7 is a schematic top view of the rack side walls 30 securing a pair of rails 20 to form a shelf or bay for receiving an electronic device or module 70. The module 70 is preferably inserted between the rail side walls 24 and rests on the shelves 25. Pushing the module 70 from the front in the distal direction of the arrow 72 (an insertion direction) causes the leading corners 74 of the module 70 to engage the rail side walls 24. Because the rail 20 provides a continuous and smooth surface, there are no rough points on which the corners 74 might catch or snag and the module slides smoothly in the distal direction. As the module 70 approaches the electrical connector 50 for blind docking, the module is laterally centered within the rack when the leading corners 74 engage the boss 28 on one or more of the rails. Centering of the module improves the alignment of an electrical connector 76 of the module 70 with the electrical connector 50 on the rail. The rail 20 that includes the electrical connector 50 preferably also includes a pin or stud 29 that will engage a tapered slot 78 in the bottom leading edge of the module 70 to further align the module for blind docking.

Figure 8:
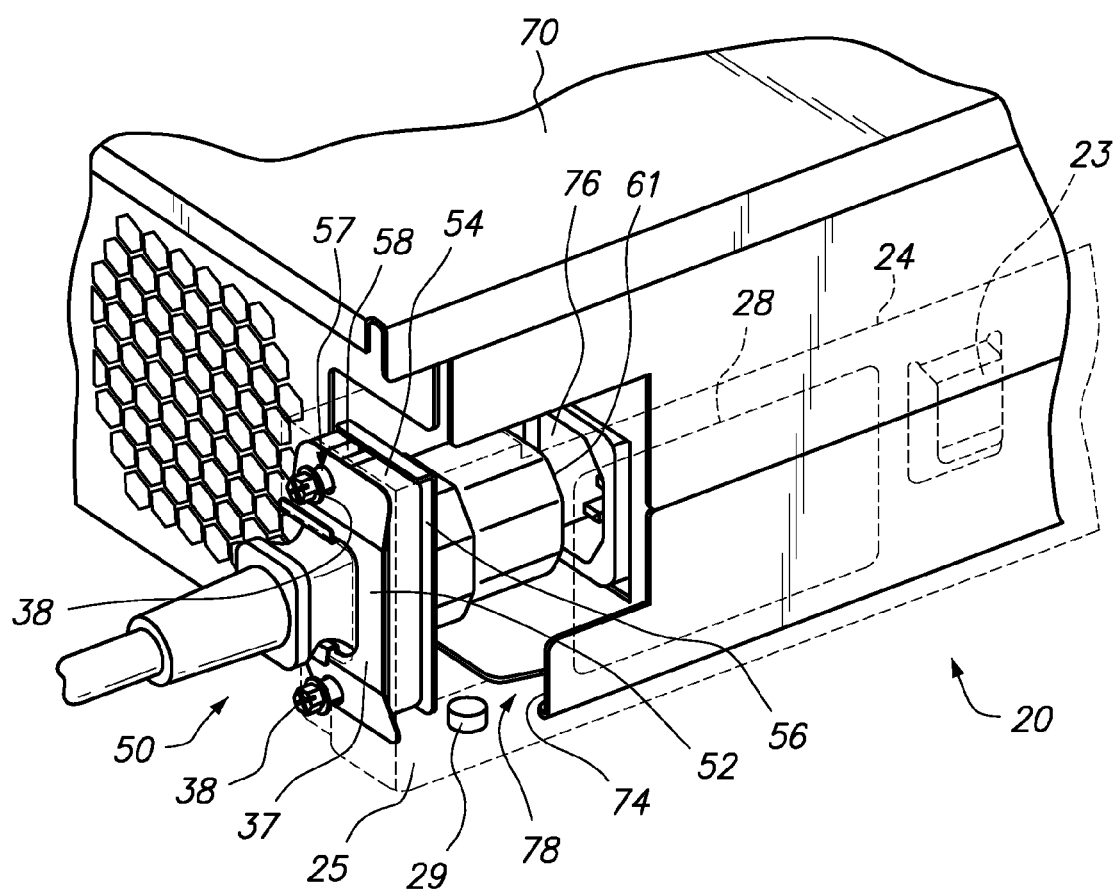
FIG. 8 is a perspective view of the electronic module received on the rails and centered within the rack.

FIG. 8 is a perspective view of the electronic module 70 received on the rails 20, centered within the rack by engagement of the leading corner 74 with the boss 28, and the tapered alignment slot 78 about to engage the stud 29. In this Figure, the rack side wall is not shown and the rail 20 (including the rail side wall 24, shelf 25 and end wall 37) is illustrated as being substantially transparent. Accordingly, it is possible to shown that the proximal end 61 of the forwardly-directed electrical connector 50 is aligned with the rearwardly-directed electrical connector 76 of the module 70. Engagement of the tapered alignment slot 78 with the stud 29 may provide further alignment and the float of the connector 50 will enable any minor adjustments to enable the connector end 61 to enter the connector 76. This embodiment provides an example of a reliable system for blind docking an electronic module with an electrical connector that is secured to a rail.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system comprising:
    a rack with opposing vertical side walls;
    a pair of longitudinally-extending shelf brackets secured to the opposing vertical side walls at a common elevation to form a bay for receiving an electronic module, wherein the shelf bracket registers the electronic module to align the rearwardly-directed power connector with the forwardly-directed power connector, and wherein the at least one shelf bracket includes a shelf having a vertical stud;
    a forwardly-directed power connector secured to a distal end of at least one of the shelf brackets for blind docking with a rearwardly-directed power connector on the electronic module; and
    wherein the electronic module has a rearwardly-directed, tapered slot for lateral alignment of the power connectors as the electronic module is being received in the bay prior to blind docking.

2. The system of claim 1, wherein each of the shelf brackets includes a boss adjacent the distal end to center the electronic module within the rack.

3. The system of claim 1, wherein the forwardly-directed power connector is forwardly-biased.

4. The system of claim 3, wherein the forwardly-directed power connector is forwardly-biased by a spring plate.

5. The system of claim 1, wherein the forwardly-directed power connector floats within a plane perpendicular to an axis of the forwardly-directed power connector.

6. The system of claim 5, wherein the forwardly-directed power connector loosely receives a pair of longitudinally extending standoffs.

7. The system of claim 5, wherein the forwardly-directed power connector is forwardly-biased by a spring plate, and wherein movement of the forwardly-directed power connector within the plane is opposed by friction between the power connector and the spring plate.

8. The system of claim 7, wherein the forwardly-directed power connector loosely receives a pair of longitudinally extending standoffs that establish a limited range within which the forwardly-directed electrical connector can move.

9. The system of claim 1, wherein the forwardly-directed power connector is coupled to an electrical cord that extends rearwardly.

10. A method of blind docking an electronic module in rack, comprising:
    securing a forwardly-directed power connector onto a distal end of a shelf bracket;
    securing the shelf bracket to a wall of the rack in a longitudinal position for selective supporting one side of an electronic module;
    sliding the electronic module along the shelf bracket toward the distal end of the shelf bracket until a rearwardly-directed power connector on a distal end of the electronic module blind docks with the forwardly-directed power connector; and
    engaging a rearwardly-directed, taper slot on the distally sliding electronic module with a stud formed on the shelf bracket to improve lateral alignment of the rearwardly-directed power connector with the forwardly-directed power connector.

11. The method of claim 10, further comprising:
    engaging the distally sliding electronic module against a boss formed on the shelf bracket to improve lateral alignment of the rearwardly-directed power connector with the forwardly-directed power connector.

12. The method of claim 10, further comprising:
    forwardly-biasing the forwardly-directed power connector.

13. The method of claim 10, further comprising:
    allowing the forwardly-directed power connector to float within a plane perpendicular to the axis of the forwardly-directed power connector.

14. The system of claim 1, wherein the pair of longitudinally-extending shelf brackets is adjustable from the front of the rack without any tools.

15. The method of claim 10, wherein the shelf bracket is secured to the wall of the rack from the front of the rack without any tools.

* * * * *